United States Patent
Sato

(10) Patent No.: US 9,915,868 B2
(45) Date of Patent: Mar. 13, 2018

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 337 days.

(21) Appl. No.: 13/667,325

(22) Filed: Nov. 2, 2012

(65) Prior Publication Data

US 2013/0134616 A1 May 30, 2013

(30) Foreign Application Priority Data

Nov. 30, 2011 (JP) ................................. 2011-262659
Oct. 22, 2012 (JP) ................................. 2012-233299

(51) Int. Cl.
| | |
|---|---|
| G03F 7/00 | (2006.01) |
| G03F 9/00 | (2006.01) |
| B29C 59/02 | (2006.01) |
| B82Y 10/00 | (2011.01) |
| B82Y 40/00 | (2011.01) |

(52) U.S. Cl.
CPC .......... *G03F 7/0002* (2013.01); *B29C 59/022* (2013.01); *B82Y 10/00* (2013.01); *B82Y 40/00* (2013.01); *G03F 9/7042* (2013.01); *G03F 9/7084* (2013.01); *G03F 9/7088* (2013.01); *B29C 2059/023* (2013.01)

(58) Field of Classification Search
None
See application file for complete search history.

(56) References Cited

U.S. PATENT DOCUMENTS

| 4,780,617 A | 10/1988 | Umatate et al. |
| 6,258,611 B1 | 7/2001 | Leroux |

(Continued)

FOREIGN PATENT DOCUMENTS

| CN | 101118380 A | 2/2008 |
| CN | 102053490 A | 5/2011 |

(Continued)

OTHER PUBLICATIONS

Chinese Official Action dated Apr. 3, 2014, issued in counterpart Chinese Patent Application No. 201210490618.1, with an English translation.

(Continued)

*Primary Examiner* — Benjamin A Schiffman
(74) *Attorney, Agent, or Firm* — Fitzpatrick, Cella, Harper & Scinto

(57) ABSTRACT

An imprint apparatus performs an imprint process by which an imprint material on a substrate is molded using a mold having a pattern region. A detector detects marks formed in each of a plurality of shot regions on the substrate. The plurality of shot regions include a first region in which all of the marks to be formed in one shot region are formed, and a second region in which some of the marks to be formed in one shot region are formed. When performing the imprint process on the second shot region, a controller obtains a shape of the second shot region based on a shape of the first shot region obtained by detecting the marks formed in the first shot region, and an amount of deformation of the pattern region by the deformation unit by using the obtained shape of the second shot region.

6 Claims, 7 Drawing Sheets

(56) References Cited

U.S. PATENT DOCUMENTS

| | | |
|---|---|---|
| 7,884,935 B2 | 2/2011 | Suehira et al. |
| 8,133,418 B2 | 3/2012 | Ando et al. |
| 8,432,548 B2 | 4/2013 | Choi et al. |
| 8,491,291 B2 | 7/2013 | Ando et al. |
| 2009/0108483 A1 | 4/2009 | Suehira et al. |
| 2010/0110434 A1 | 5/2010 | Choi et al. |
| 2011/0074064 A1 | 3/2011 | Hayashi |
| 2011/0147970 A1 | 6/2011 | Sato |
| 2011/0206852 A1 | 8/2011 | Shiode |

FOREIGN PATENT DOCUMENTS

| | | | |
|---|---|---|---|
| CN | 102162992 A | | 8/2011 |
| JP | 61-044429 A | | 3/1986 |
| JP | H09-306811 A | | 11/1997 |
| JP | 2003-512740 T | | 4/2003 |
| JP | 4185941 B | | 11/2008 |
| JP | 2010-080714 A | | 4/2010 |
| JP | 2011-146689 A | | 7/2011 |
| JP | 2012-507882 T | | 3/2012 |
| KR | 10-2011-0069730 A | | 6/2011 |
| KR | 10-2011-0083713 A | | 7/2011 |
| WO | 01/29619 A | | 4/2001 |
| WO | 2010/053519 A | | 5/2010 |

OTHER PUBLICATIONS

Partial English translation of Japanese Official Action dated Jul. 29, 2016, in corresponding Japanese Patent Application No. 2012233299.

Japanese Official Action dated Jul. 29, 2016, issued in corresponding Japanese Patent Application No. 2012-233299.

Korean Official Action dated Feb. 26, 2015, issued in corresponding Korean Patent Application No. 10-2012-0132753.

F I G. 1
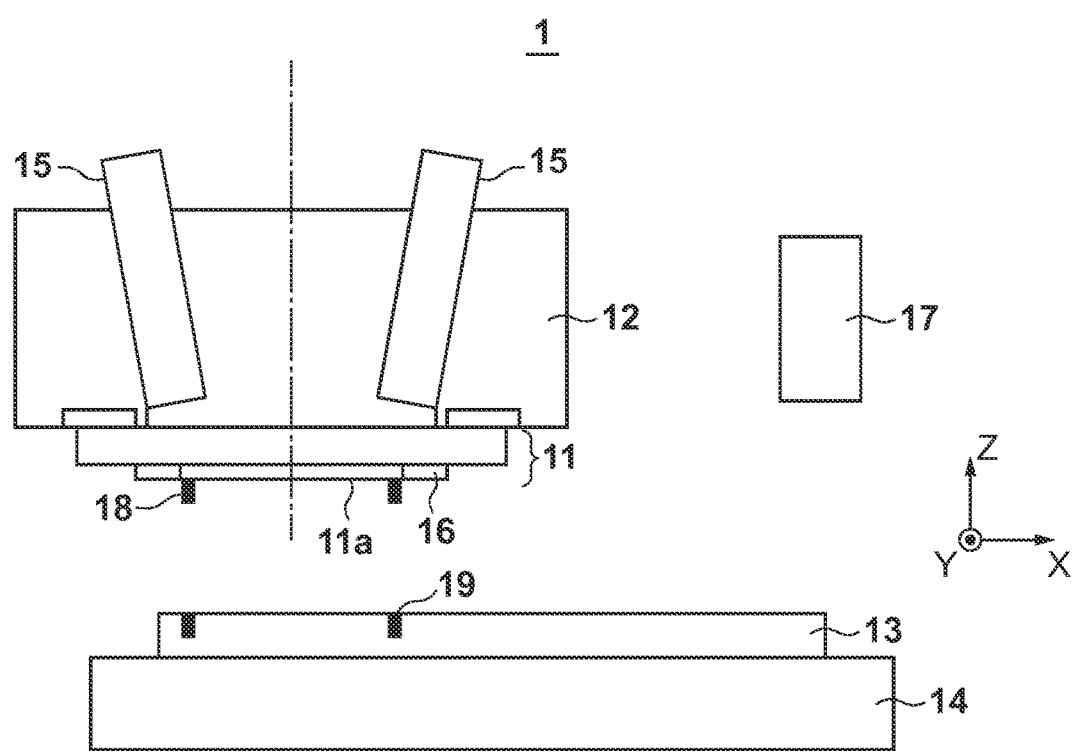

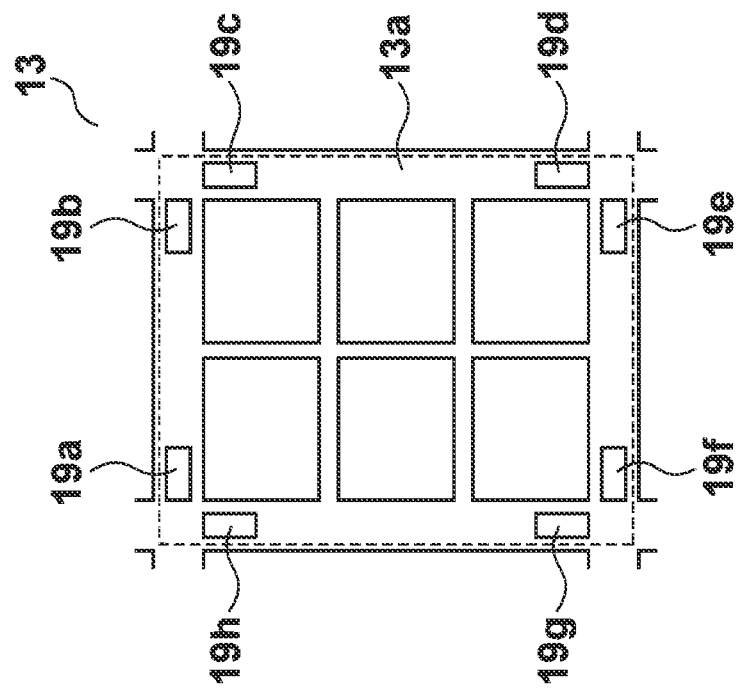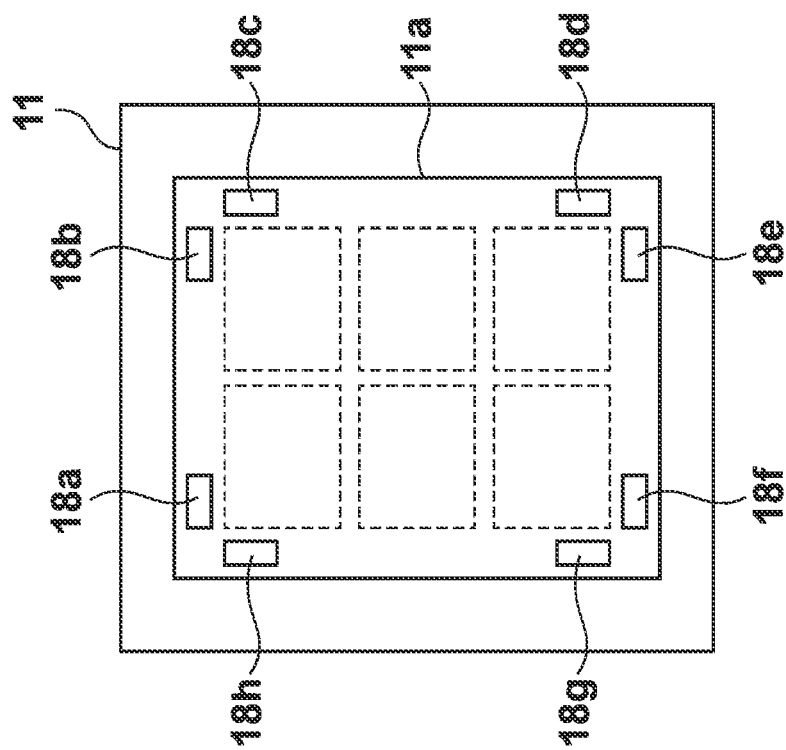

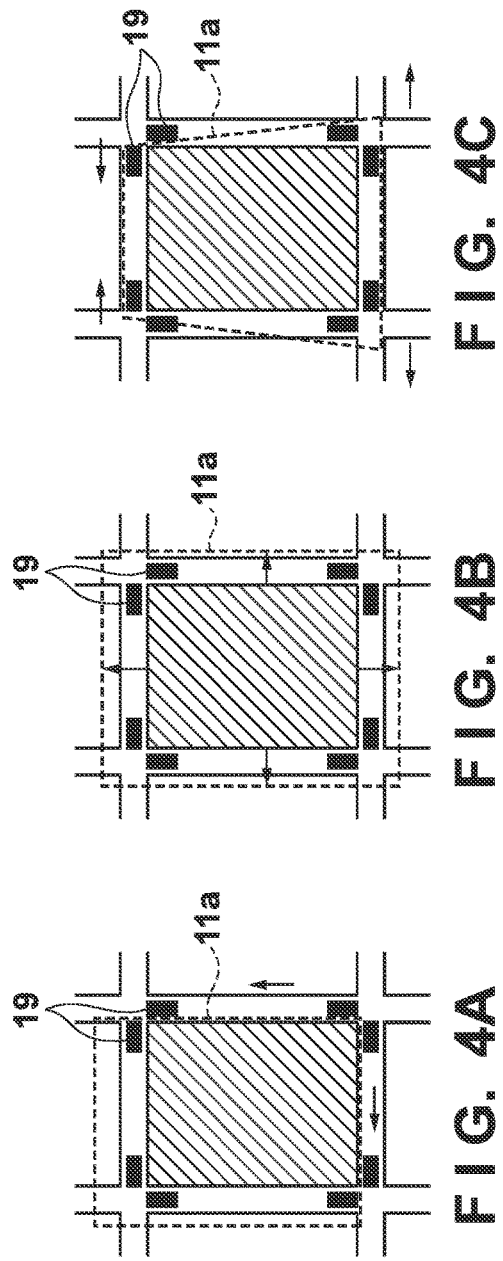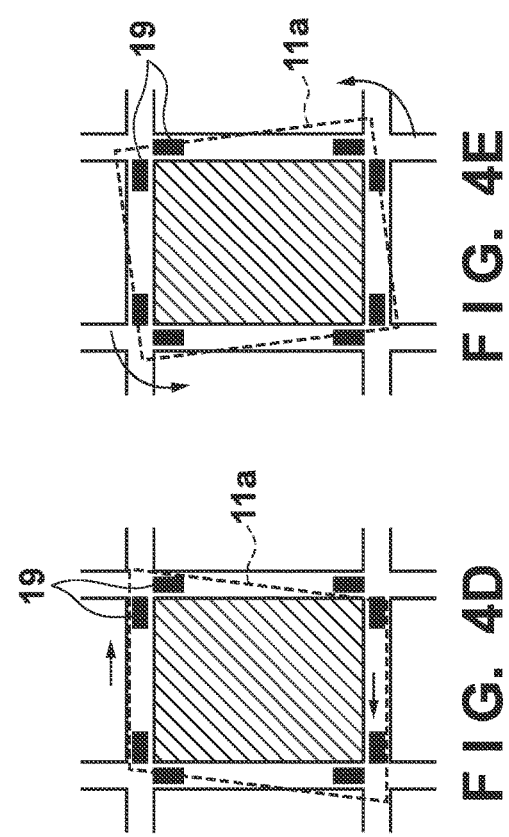

IMPRINT APPARATUS, IMPRINT METHOD, AND ARTICLE MANUFACTURING METHOD

CLAIM OF PRIORITY

This application claims the benefit of Japanese Patent Application No. 2011-262659, filed on Nov. 30, 2011, and No. 2012-233299, filed on Oct. 22, 2012, which are hereby incorporated by reference herein in their entirety.

BACKGROUND OF THE INVENTION

Field of the Invention

The present invention relates to an imprint apparatus, an imprint method, and an article manufacturing method.

Description of the Related Art

The imprint technique is a technique capable of transferring nanoscale micropatterns, and is proposed in Japanese Patent No. 4185941 as a nanolithography technique for the mass-production of semiconductor devices and magnetic storage media. In an imprint apparatus using the imprint technique, a resin (imprint material) on a substrate is cured while a mold having a pattern region, on which a pattern is formed, is pressed against the resin, and the pattern is transferred onto the substrate by releasing the mold from the cured resin.

This imprint apparatus adopts a die-by-die alignment method as a method of aligning (positioning) the mold and the substrate. The die-by-die alignment method is an alignment method of optically detecting a mark formed in each of a plurality of shot regions on a substrate, and correcting a displacement of the positional relationship between the substrate and a mold. In this method, in order to match the shape of each shot region on the substrate with that of a pattern region formed on the mold, a plurality of marks formed in the periphery of the shot region and a plurality of marks formed in the periphery of the pattern region are detected, and a displacement (for example, a shift or magnification) of the shot region is obtained.

The productivity of the imprint apparatus is increased by obtaining many chips from one substrate. When a plurality of chip regions are arranged in one shot region, therefore, an imprint process must be performed on a partial shot region near the edge of a substrate, in order to obtain some chips from even the partial shot region. "The partial shot region" herein mentioned is a shot region to which the whole pattern of a mold cannot be transferred.

Unfortunately, a plurality of marks for obtaining a displacement of a shot region are generally formed in the four corners in the periphery of the shot region. In a partial shot region, therefore, marks sufficient in number to obtain a displacement of the partial shot region are often not formed. Accordingly, the shape of a partial shot region cannot be matched with that of the pattern region of a mold, and this makes it impossible to accurately align the mold and a substrate.

SUMMARY OF THE INVENTION

The present invention provides a technique advantageous in aligning a mold and a substrate in an imprint apparatus.

According to one aspect, the present invention provides an imprint apparatus for performing an imprint process by which an imprint material on a substrate is molded by using a mold having a pattern region on which a pattern is formed, thereby transferring the pattern onto the substrate, that includes a detector configured to detect marks formed in each of a plurality of shot regions on the substrate, a deformation unit configured to deform the pattern region, and a controller configured to control the imprint process, wherein the plurality of shot regions include a first shot region in which all of the marks to be formed in one shot region are formed, and a second shot region in which some of the marks to be formed in one shot region are not formed, and when performing the imprint process on the second shot region, the controller calculates a shape of the second shot region from results obtained by the detector by detecting the marks formed in the first shot region, and controls an amount of deformation of the pattern region by the deformation unit by using the calculated shape of the second shot region.

Further aspects of the present invention will become apparent from the following description of exemplary embodiments with reference to the attached drawings.

BRIEF DESCRIPTION OF THE DRAWINGS

FIG. 1 is a view showing the arrangement of an imprint apparatus according to an aspect of the present invention.

FIGS. 3A and 3B are views for explaining mold-side marks and substrate-side marks.

FIGS. 4A to 4E are views showing displacements produced between the shape and the position of the pattern region of a mold, and the shape and the position of a shot region on a substrate.

DESCRIPTION OF THE EMBODIMENTS

Figure 2:
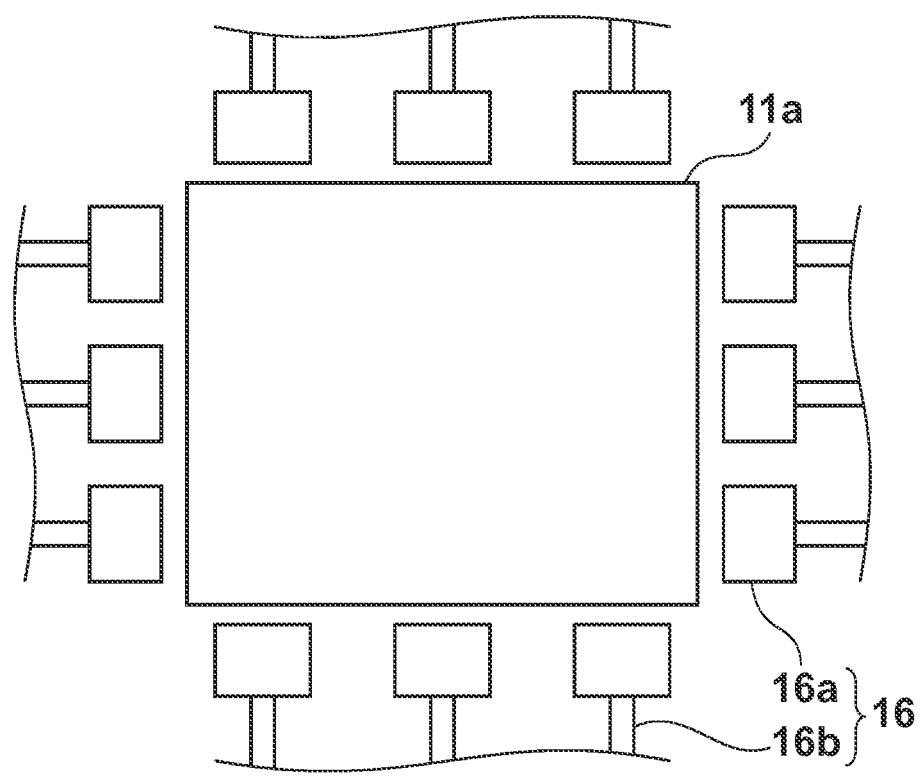
FIG. 2 is a view showing the arrangement of a correcting mechanism of the imprint apparatus shown in FIG. 1.

Preferred embodiments of the present invention will be described below with reference to the accompanying drawings. Note that the same reference numerals denote the same members throughout the drawings, and a repetitive description thereof will not be given.

FIG. 1 is a view showing the arrangement of an imprint apparatus 1 according to an aspect of the present invention. The imprint apparatus 1 is a lithography apparatus to be used in the manufacturing steps to manufacture a semiconductor device, or the like. The imprint apparatus 1 performs an imprint process in which an imprint material on a substrate is molded and cured by using an original having a pattern region on which a pattern is formed, and the pattern is transferred onto the substrate by releasing (removing) the original from the cured imprint material. In this embodiment, the imprint apparatus 1 uses a mold as the original, and a resin as the imprint material. Also, the imprint apparatus 1 adopts a photo-curing method of curing a region by ultraviolet irradiation, as the resin curing method.

The imprint apparatus 1 includes a mold holder 12 for holding a mold 11, a substrate holder 14 for holding a substrate 13, a detector 15, a correcting mechanism 16 (FIG. 2), and a controller 17. The imprint apparatus 1 also includes a resin supply unit including a dispenser for supplying an ultraviolet-curing resin onto the substrate, a bridge platen for holding the mold holder 12, and a base platen for holding the substrate holder 14.

The mold 11 has a pattern region 11a on which a pattern to be transferred to (the resin on) the substrate 13 is formed into a three-dimensional shape. The mold 11 is made of a material (for example, quartz) that transmits ultraviolet light for curing the resin on the substrate 13. Mold-side marks (first marks) 18 are formed on the mold 11, more specifically, on the pattern region 11a. Referring to FIG. 1, the mold-side marks 18 are formed in the periphery of the pattern region 11a.

The mold holder 12 is a holding mechanism for holding the mold 11, and includes a mold chuck for chucking the mold 11 by vacuum suction or electrostatic attraction, a mold stage for mounting the mold chuck on it, and a driving system for driving the mold stage. This driving system drives the mold stage (that is, the mold 11) in at least the Z-axis direction (an imprint direction in which the mold 11 is imprinted on the resin on the substrate 13). The driving system may also have a function of driving the mold stage in the X-axis direction, the Y-axis direction, and the θ direction (a rotational direction around the Z-axis), in addition to the Z-axis direction.

The substrate 13 is a substrate to which the pattern of the mold 11 is to be transferred, and includes a single-crystal silicon wafer or SOI (Silicon On Insulator) wafer. A resin is supplied (dispensed) on the substrate 13. Also, substrate-side marks (second marks) 19 are formed in each of a plurality of shot regions on the substrate 13.

The substrate holder 14 is a holding mechanism for holding the substrate 13, and includes a substrate chuck for chucking the substrate 13 by vacuum suction or electrostatic attraction, a substrate stage for mounting the substrate chuck on it, and a driving system for driving the substrate stage. This driving system drives the substrate stage (that is, the substrate 13) in at least the X-axis direction and the Y-axis direction (directions perpendicular to the imprint direction of the mold 11). The driving system may also have a function of driving the substrate stage in the Z-axis direction and the θ direction (the rotational direction around the Z-axis), in addition to the X-axis direction and the Y-axis direction.

The detector 15 is a scope for optically detecting (observing) the mold-side marks 18 formed on the mold 11, and the substrate-side marks 19 formed in each of the plurality of shot regions on the substrate 13. The detector 15 need only be capable of detecting the relative positions of the mold-side marks 18 and the substrate-side marks 19. Accordingly, the detector 15 can be a scope including an optical system for sensing images of two marks at the same time, and can also be a scope for sensing an interference signal of two marks or a signal generated by a synergistic effect, such as moire. Furthermore, the detector 15 need not be able to simultaneously detect the mold-side marks 18 and the substrate-side marks 19. For example, the detector 15 may detect the relative positions of the mold-side marks 18 and the substrate-side marks 19 by obtaining the positions of the mold-side marks 18 and the substrate-side marks 19 with respect to a reference position formed inside the detector 15.

The correcting mechanism (deformation unit) 16 deforms (the shape of) the pattern region 11a by applying a force to the mold 11 in a direction parallel to the pattern region 11a. For example, as shown in FIG. 2, the correcting mechanism 16 includes attracting portions 16a for attracting the side surfaces of the mold 11, and actuators 16b for driving the attracting portions 16a in a direction in which the attracting portions 16a move toward the side surfaces of the mold 11, and a direction in which they move away from the side surfaces of the mold 11. However, the correcting mechanism 16 may also deform the pattern region 11a by controlling the temperature of the mold 11 by heating it. It is also possible to use a mechanism that deforms a shot region by controlling the temperature of the substrate 13 by heating it, instead of the correcting mechanism 16.

The controller 17 includes a CPU and a memory, and controls the whole of the imprint apparatus 1 (each unit of the imprint apparatus 1). In this embodiment, the controller 17 controls an imprint process and processes related to the imprint process. For example, when performing the imprint process, the controller 17 positions (aligns) the mold 11 and the substrate 13 based on the detection results from the detector 15. Also, when performing the imprint process, the controller 17 controls the amount of deformation of the pattern region 11a of the mold 11 by the correcting mechanism 16.

The mold-side marks 18 and the substrate-side marks 19, as alignment marks to be used to position the mold 11 and substrate 13, will be explained below with reference to FIGS. 3A and 3B. In this embodiment, six chip regions are arranged in one shot region on the substrate 13.

FIG. 3A shows the pattern region 11a of the mold 11, more specifically, mold-side marks 18a to 18h formed in the four corners of the pattern region 11a. For example, the mold-side marks 18a, 18b, 18e, and 18f having a longitudinal direction in the horizontal direction are marks having a measurement direction in the X-axis direction. Also, the mold-side marks 18c, 18d, 18g, and 18h having a longitudinal direction in the vertical direction are marks having a measurement direction in the Y-axis direction. In FIG. 3A, regions enclosed within the dotted lines indicate pattern regions in which patterns to be transferred to six chip regions are formed.

FIG. 3B shows substrate-side marks 19a to 19h formed in the periphery of one shot region 13a on the substrate 13, more specifically, in the four corners of the shot region 13a. For example, the substrate-side marks 19a, 19b, 19e, and 19f having a longitudinal direction in the horizontal direction are marks having a measurement direction in the X-axis direction. Also, the substrate-side marks 19c, 19d, 19g, and 19h having a longitudinal direction in the vertical direction are marks having a measurement direction in the Y-axis direction. In FIG. 3B, regions enclosed within the solid lines inside the shot region 13a indicate chip regions.

When performing the imprint process, that is, when bringing the mold 11 and a resin on the substrate 13 into contact with each other, the mold-side marks 18a to 18h and substrate-side marks 19a to 19h are respectively positioned close to each other. Accordingly, the shape and the position of the pattern region 11a of the mold 11 and the shape and the position of the shot region 13a on the substrate 13 can be compared by detecting the mold-side marks 18 and the substrate-side marks 19 by the detector 15. If differences (displacements) are produced between the shape and the position of the pattern region 11a of the mold 11 and the shape and the position of the shot region 13a on the substrate 13, the overlay accuracy decreases, and a pattern transfer error (product defect) occurs.

FIGS. 4A to 4E are views each showing a displacement (to be referred to as "a displacement between the mold 11 and the shot region 13a" hereafter) produced between the shape and the position of the pattern region 11a of the mold 11 and the shape and the position of the shot region 13a on the substrate 13. The displacement between the mold 11 and the shot region 13a includes a shift, a magnification displacement, and a rotation. It is possible to estimate whether the displacement between the mold 11 and the shot region 13a is a shift, a magnification displacement, or a rotation, by detecting the displacement amount (position displacement amount) between the relative positions of the substrate-side mark 19 and the mold-side mark 18.

FIG. 4A shows a state in which the displacement between the mold 11 and the shot region 13a is a shift. If it is detected that the mold-side marks 18 are displaced in one direction from the substrate-side marks 19, it is possible to estimate that the displacement between the mold 11 and the shot region 13a is a shift.

FIG. 4B shows a state in which the displacement between the mold 11 and the shot region 13a is a magnification displacement. If it is detected that the mold-side marks 18 are evenly displaced outward or inward with respect to the center of the shot region 13a, it is possible to estimate that the displacement between the mold 11 and the shot region 13a is a magnification displacement.

FIG. 4C shows a state in which the displacement between the mold 11 and the shot region 13a is a trapezoidal displacement. If it is detected that the mold-side marks 18 are displaced outward or inward with respect to the center of the shot region 13a and the directions are different in the upper and lower portions or the right and left portions of the shot region 13a, it is possible to estimate that the displacement between the mold 11 and the shot region 13a is a trapezoidal displacement. Also, if it is detected that the mold-side marks 18 are displaced outward or inward with respect to the center of the shot region 13a and the displacement amounts are different in the upper and lower portions or the right and left portions of the shot region 13a, it is possible to estimate that the displacement between the mold 11 and the shot region 13a is a trapezoidal displacement.

FIG. 4D shows a state in which the displacement between the mold 11 and the shot region 13a is a twist. If it is detected that the displacement directions of the mold-side marks 18 are different in the upper and the lower portions or the right and left portions of the shot region 13a, it is possible to estimate that the displacement between the mold 11 and the shot region 13a is a twist.

FIG. 4E shows a state in which the displacement between the mold 11 and the shot region 13a is a rotation. If the displacement directions of the mold-side marks 18 shown in FIG. 4D are different in the upper and lower portions and right and left portions of the shot region 13a, and the mold-side marks 18 are displaced to draw a circle around a given point in the shot region, it is possible to estimate that the displacement between the mold 11 and the shot region 13a is a rotation.

When the displacement between the mold 11 and the shot region 13a is a magnification displacement, a trapezoidal displacement, a twist, or a rotation, as shown in FIGS. 4B to 4E, the controller 17 deforms the shape of the pattern region 11a of the mold 11 by the correcting mechanism 16. More specifically, the controller 17 controls the amount of deformation of the pattern region 11a by the correcting mechanism 16, so that the shape of the pattern region 11a matches that of the shot region 13a. The controller 17 obtains data representing the correspondence between the driving amounts of the actuators 16b (that is, the force to be applied to the mold 11) and the deformation amount of the pattern region 11a and stores the data in the memory, or the like, beforehand. Also, based on the detection results from the detector 15, the controller 17 calculates the deformation amount of the pattern region 11a, which is required to match the shape of the pattern region 11a with that of the shot region 13a. In other words, the controller 17 calculates the degree of deformation of the pattern region 11a from the position displacement amounts between the mold-side marks 18 and the substrate-side marks 19 detected by the detector 15. Then, the controller 17 calculates the driving amounts of the actuators 16b, which correspond to the calculated deformation amount of the pattern region 11a, based on the data stored in the memory, and drives the actuators 16b.

Figure 5:
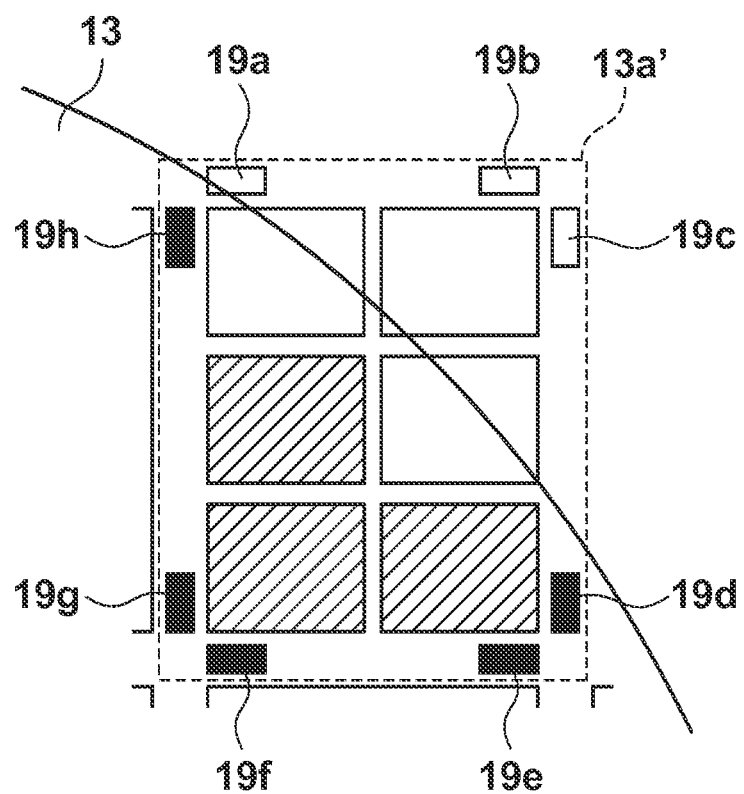
FIG. 5 is a view showing a partial shot region on the substrate.

In the imprint apparatus 1, the imprint process is performed even on a shot region (partial shot region) including the outer periphery of the substrate 13, in order to increase the productivity by obtaining many chips from one substrate 13. FIG. 5 is a view showing a partial shot region 13a' on the substrate 13. FIG. 5 shows that about one half of the partial shot region 13a' is positioned inside of the substrate 13, and the other half is positioned outside of the substrate 13, so the whole pattern of the mold 11 cannot be transferred to the partial shot region 13a'. In the partial shot region 13a', therefore, it is impossible to form the substrate-side marks 19a to 19c of the substrate-side marks 19a to 19h to be formed in (the periphery of) one shot region. In other words, the partial shot region 13a' is a shot region in which some of the substrate-side marks 19a to 19h to be formed in one shot region are not formed. Also, referring to FIG. 5, among six chip regions included in the partial shot region 13a', perfect chips (products) can be obtained from three hatched chip regions, but no perfect chips can be obtained from three remaining chip regions. However, when perfect chips are obtained by performing the imprint process even on the partial shot region 13a', it is possible to increase the yield of the imprint apparatus 1, and largely increase the productivity.

As described above, not all of the substrate-side marks 19a to 19h to be formed in one shot region are formed in the partial shot region 13a', and some of the substrate-side marks 19a to 19h, that is, substrate-side marks 19a to 19c are not formed. In this case, even when the detector 15 detects the substrate-side marks 19d to 19h, the shape and the position of the partial shot region 13a' cannot be calculated (specified). This is so, because it is impossible to detect substrate-side marks necessary in number to calculate the shape and the position of the partial shot region 13a' (that is, all of the substrate-side marks 19a to 19h). Accordingly, the shape and the position of the pattern region 11a of the mold 11 cannot be compared with the shape and the position of the partial shot region 13a' on the substrate 13 (that is, the displacement between the mold 11 and the partial shot region 13a' cannot be obtained). Consequently, in the partial shot region 13a', it is impossible to perform a correction that reduces the difference between the shape of the pattern region 11a of the mold 11 and that of the partial shot region 13a'. In other words, it is impossible to control the shape of the pattern region 11a as described above, and the overlay accuracy decreases.

In this embodiment, therefore, of a plurality of shot regions on the substrate 13, the imprint process is performed by using the die-by-die alignment method on a shot region other than a partial shot region, i.e., on a shot region to which the whole pattern (pattern region 11a) of the mold 11 can be transferred. A shot region to which the whole pattern of the mold 11 can be transferred is a shot region in which all of the substrate-side marks 19a to 19h to be formed in one shot region are formed. On the other hand, the imprint process is performed on a partial shot region by estimating the shape of the partial shot region by statistically processing the substrate-side mark detection results obtained by the imprint process (die-by-die alignment method) performed on shot regions other than partial shot regions. This makes it possible to perform a correction that matches the shape of the pattern region of the mold with that of a partial short region, in which some substrate-side marks are not formed, and to which the die-by-die alignment method cannot be applied.

Figure 6:
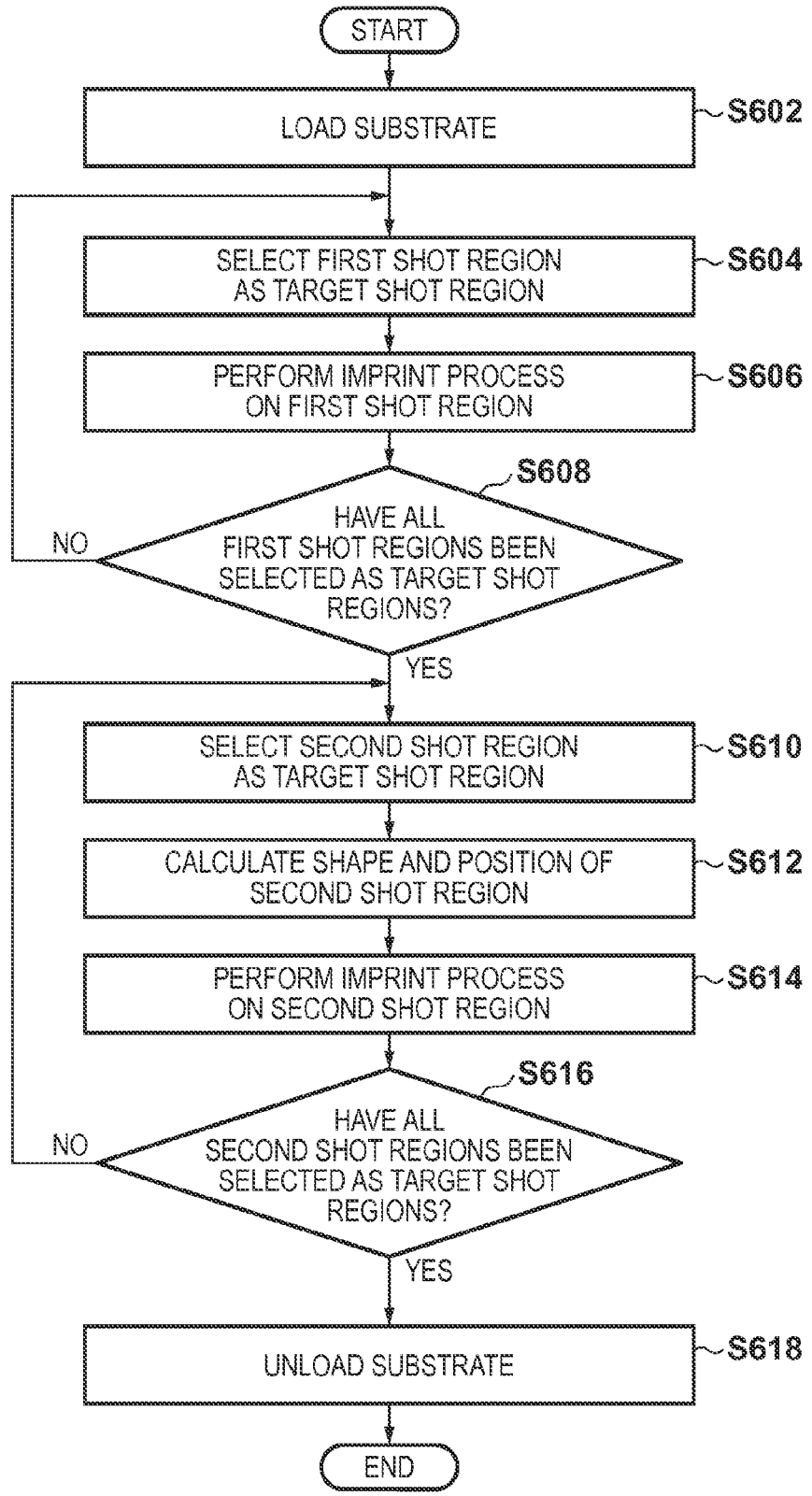
FIG. 6 is a flowchart for explaining the operation of the imprint apparatus shown in FIG. 1.
Figure 7:
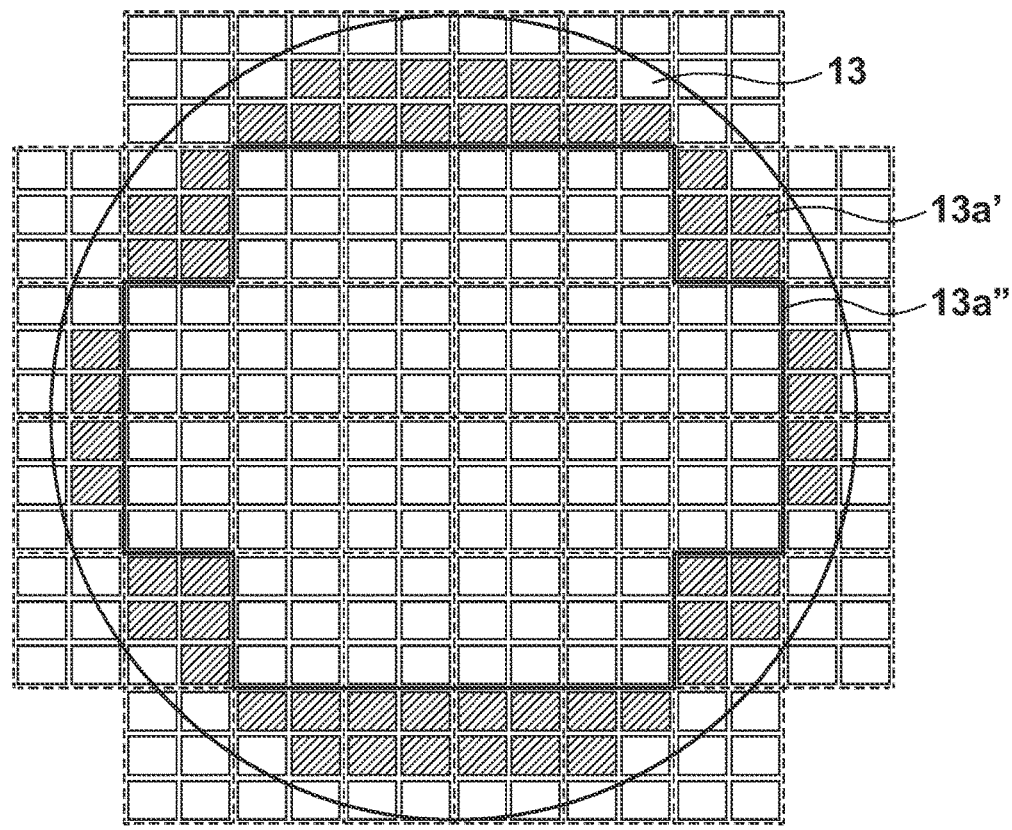
FIG. 7 is a view showing the layout of a plurality of shot regions on the substrate.

The operation of the imprint apparatus 1 (an imprint method using the imprint apparatus 1) will be explained below with reference to FIG. 6. The controller 17 performs this operation by comprehensively controlling each unit of the imprint apparatus 1. Assume that a region, including six chip regions, is one shot region, as shown in FIG. 7. Also, a shot region including six chip regions will be called a first shot region 13a", and a shot region including only some of the six chip regions will be called a second shot region 13a'. As described above, the first shot region 13a" is a shot region in which all of the substrate-side marks to be formed in one shot region are formed, and to which the whole pattern of the mold 11 can be transferred. The second shot region 13a' is a partial shot region in which some of the substrate-side marks to be formed in one shot region are not formed, and to which the whole pattern of the mold 11 cannot be transferred. Note that, in the second shot region 13a' shown in FIG. 7, chip regions from which perfect chips can be obtained are hatched, and chip regions from which no perfect chips can be obtained and chip regions not existing on the substrate 13 are blanked.

In step S602, a substrate transport mechanism (not shown) is used to load the substrate 13 (see FIG. 7) into the imprint apparatus 1, and to hold the substrate 13 by the substrate holder 14.

In step S604, one first shot region 13a" is selected as a target shot region from a plurality of shot regions on the substrate 13. "A target shot region" herein mentioned is a shot region to which the pattern of the mold 11 is to be transferred.

In step S606, the imprint process is performed on the first shot region 13a" selected as a target shot region, in step S604. More specifically, a resin is supplied to the first shot region 13a" selected as a target shot region, and the first shot region 13a" (target shot region) is set in a position (the imprint position of the mold 11) opposing the pattern of the mold 11. Then, the mold 11 and the resin on the first shot region 13a" are brought into contact with each other, while the detector 15 is detecting the mold-side marks 18 formed on the mold 11 and the substrate-side marks 19 formed in the first shot region 13a". In this process, the mold 11 and the substrate 13 are positioned so as to match the positions of the mold-side marks 18 and the substrate-side marks 19 detected by the detector 15. This positioning of the mold 11 and the substrate 13 includes deformation of the pattern region 11a of the mold 11 by the correcting mechanism 16, and adjustment of the relative positions of the mold 11 and the substrate 13 by the mold holder 12 and substrate holder 14. Then, in order to cure the resin on the first shot region 13a", the resin on the first shot region 13a" is irradiated with ultraviolet light while the mold 11 and the resin are in contact with each other. After that, the mold 11 is released (removed) from the cured resin on the first shot region 13a" by the mold holder 12 and the substrate holder 14. Consequently, the pattern of the mold 11 is transferred to the first shot region 13a" on the substrate 13. Also, the results obtained by the detector 15 by detecting the substrate-side marks 19 formed in the first shot region 13a" in step S606 are stored in, for example, the memory of the controller 17. In this case, it is possible to store the positions of the substrate-side marks 19, or the shape of the shot region obtained from the substrate-side marks 19.

In step S608, whether all of the first shot regions 13a" on the substrate 13 have been selected as target shot regions is determined. If not all of the first shot regions 13a" have been selected as target shot regions, the process returns to step S604, and a next first shot region 13a" is selected as a target shot region. If all of the first shot regions 13a" have been selected as target shot regions, the process advances to step S610.

In step S610, one second shot region 13a' is selected as a target shot region from the plurality of shot regions on the substrate 13.

In step S612, the shape and the position of the second shot region 13a' selected as a target shot region in step S610 are calculated based on the results obtained by the detector 15, by detecting the substrate-side marks 19 formed in the first shot regions 13a" (the detection results from the detector 15 in step S606). For example, the shape and the position of the second shot region 13a' are calculated by statistically processing the results obtained by the detector 15, by detecting the substrate-side marks 19 formed in the first shot regions 13a". An example of "the statistical processing" herein mentioned is a process of calculating the shape and the position of the second shot region 13a' so as to minimize the average deviation of the displacement amounts (the relative position displacements and shape differences) between the mold and the first shot regions 13a". For example, the shape and the position of the second shot region 13a' can be calculated from the relationship between the positions of shot regions arranged from the center to the outer periphery of the substrate 13, and the displacement amounts between the mold and the shot regions. Details of this statistical processing are disclosed in Japanese Patent Laid-Open No. 61-44429. Note that, in step S612, it is possible to calculate, not only the shape and the position of the second shot region 13a' selected as a target shot region in step S610, but also, the shapes and the positions of remaining second shot regions 13a'. Note that the results obtained by detecting the marks formed in the first shot regions 13a" are stored as they are associated with a position on the entire surface of the substrate 13. More specifically, the two kinds of positions can be stored, as they are associated with each other, by measuring the position of the substrate stage by using a measurement unit (not shown) when detecting the marks. This measurement unit is generally preferably an interferometer or encoder, but is not limited to this.

In step S614, the imprint process is performed on the second shot region 13a' selected as a target shot region, in step S610. This imprint process for the second shot region 13a' is the same as the imprint process for the first shot region 13a". However, substrate-side marks necessary in number to calculate the shape and the position of the second shot region 13a' are not formed in it. Therefore, the shape and the position of the second shot region 13a' calculated in step S612 are used when bringing the mold 11 into contact with the resin on the second shot region 13a'. More specifically, the mold 11 and the substrate 13 are positioned so as to reduce the difference between the shape of the second shot region 13a' calculated in step S612 and the shape of the pattern region 11a of the mold 11 obtained from the results obtained by the detector 15 by detecting the mold-side marks 18. As described previously, the positioning of the mold 11 and the substrate 13 includes deformation of the pattern region 11a of the mold 11 by the correcting mechanism 16, and adjustment of the relative positions of the mold 11 and the substrate 13 by the mold holder 12 and the substrate holder 14. Also, when substrate-side marks detectable by the detector 15 are formed in the second shot region 13a', the detector 15 can detect these substrate-side marks. The shape of the second shot region 13a' calculated in step S612 can also be corrected by using the detection results of the substrate-side marks formed in the second shot region 13a'. In other words, the shape of the second shot region 13a' can also be calculated again from the detection results of the substrate-side marks formed in the first shot regions 13a" and the detection results of the substrate-side marks formed in the second shot region 13a'.

The method of using the detection results of the substrate-side marks formed in the second shot region 13a', in addition to the shape and the position of the second shot region calculated in step S612, is not limited to shape correction. That is, position correction may also be performed using the substrate-side marks detected in the second shot region. More specifically, the shape of the second shot region 13a' is obtained by using the shape calculated in step S612, and the position of the second shot region 13a' is obtained by using the substrate-side marks detected in the second shot region. This is so, because not all of the substrate-side marks formed in a shot region are necessary to detect and to correct the position displacement between the mold and the substrate.

Also, a given component of the shape of the second shot region calculated in step S612 can be corrected in accordance with the number of substrate-side marks (detectable by the scope 15) formed in the second shot region 13a'. For example, when a plurality of substrate-side marks formed in the X-axis direction are detectable, the magnification in the X-axis direction of the shape of the second shot region calculated in step S612 can be corrected by using the detection results of the substrate-side marks.

Furthermore, both of the shape and the position can be corrected by using the detection results of the substrate-side marks formed in the second shot region 13a', in addition to the shape and the position of the second shot region calculated in step S612. It is also possible to determine whether to correct the shape and the position of the second shot region calculated in step S612, and to determine the type of correction, in accordance with the number of substrate-side marks detectable by the scope 15.

In step S616, whether all of the second shot regions 13a' on the substrate 13 have been selected as target shot regions is determined. If not all of the second shot regions 13a' have been selected as target shot regions, the process returns to step S610, and a next second shot region 13a' is selected as a target shot region. If all of the second shot regions 13a' have been selected as target shot regions, the process advances to step S618.

In step S618, the substrate transport mechanism is used to unload, from the imprint apparatus 1, the substrate 13 on which the pattern of the mold 11 is transferred to all of the shot regions (the first shot regions 13a" and second shot regions 13a'), thereby completing the operation.

In this embodiment, as described above, the imprint process is performed on the second shot regions 13a' (partial shot regions) after the imprint process is performed on the first shot regions 13a". The shape and the position of the second shot region 13a' are calculated (estimated) from the results obtained by the detector 15, by detecting the substrate-side marks formed in the first shot regions 13a". Accordingly, even for the second shot region 13a' to which the die-by-die alignment method cannot be applied, because some substrate-side marks are not formed, it is possible to perform a correction that matches the shape of the pattern region of the mold with that of the second shot region 13a'. Consequently, the imprint apparatus 1 can perform the imprint process on the second shot regions 13a' without decreasing the overlay accuracy.

In this embodiment, the mold-side marks 18 and the substrate-side marks 19 are separately formed in each of the two measurement directions (the X-axis direction and the Y-axis direction). However, the mold-side marks 18 and the substrate-side marks 19 may also be formed such that one mark has a plurality of measurement directions. In addition, the numbers and layouts of the mold-side marks 18 and the substrate-side marks 19 can be optimized in accordance with the overlay accuracy required of the imprint apparatus 1.

In this embodiment, the shape and the position of the second shot region 13a' are calculated from the results obtained by the detector 15 by detecting the substrate-side marks 19 formed in all of the first shot regions 13a". However, the shape and the position of the second shot region 13a' may also be calculated from the results obtained by the detector 15 by detecting the substrate-side marks 19 formed in some of the first shot regions 13a". In this case, the shape and the position of the second shot region 13a' selected as a target shot region can be calculated from the detection results of the substrate-side marks formed in the first shot region 13a" adjacent to the second shot region 13a'. This is so, because the first shot region 13a" adjacent to the second shot region 13a' can be regarded as being a shot region having a high relevance to the second shot region 13a'. Furthermore, the shape of the first shot region 13a" adjacent to the second shot region 13a' can be used to calculate the shape of the second shot region 13a'. The position of the second shot region 13a' can be obtained based on a relative position (preset shot region design value) with respect to an adjacent shot region, or by using the detection results of some substrate-side marks formed in the second shot region. Thus, the shape and the position of the second shot region 13a' can also be calculated from the detection results of the substrate-side marks formed in the first shot region 13a" adjacent to the second shot region 13a'.

In this embodiment, the first shot region, in which all of the substrate-side marks to be formed in one shot region are formed, is explained as a shot region near the center of the substrate, and the second shot region, in which some of the substrate-side marks to be formed in one shot region are not formed, is explained as a shot region near the periphery of the substrate.

However, the first shot region and the second shot region are not limited to the above shot region. For example, in the shot region near the center of the substrate, some of the substrate-side marks to be formed in one shot region may be damaged by a foreign particle, etc. In this case, some of the substrate-side marks cannot be detected in this shot region. Therefore, even if a certain shot region is the shot region near the center of the substrate, the certain shot region in which some of the substrate-side marks to be formed in one shot region are not formed can be assumed to be the second shot region. For the second shot region near the center of the substrate, by correcting its shape and the position using the above-mentioned method, the imprint process can be performed without decreasing the overlay accuracy.

Moreover, in such a case, if the imprint process is performed (started) from the shot region near the center of the substrate, a shot region, which is assumed to be the second shot region (shot region in which some of the substrate-side marks cannot be detected), may be generated in an initial stage. In this case, the imprint process may be performed while correcting the mold based on information of the other substrate (the shape and the position of the shot region) so that the imprint process is completed in advance.

As described above, the imprint apparatus 1 can perform the imprint process on a partial shot region without decreasing the overlay accuracy, and hence, can economically provide an article, such as a high quality semiconductor device or a liquid crystal display element at high throughput. A method of manufacturing a device (for example, a semiconductor device or a liquid crystal display element), as an article, will be explained below. This manufacturing method includes a step of transferring (forming) a pattern on a substrate (for example, a wafer, a glass plate, or a film-like substrate) by using the imprint apparatus 1. The manufacturing method further includes a step of etching the substrate having the transferred pattern. Note that, when manufacturing another article, such as a patterned medium (a recording medium) or an optical element, the manufacturing method includes another processing step of processing the substrate having the transferred pattern, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus for performing an imprint process by which an imprint material on a substrate is molded by using a mold having a pattern region on which a pattern is formed, the apparatus comprising:
    (A) a detector configured to detect a mark formed in each of a plurality of shot regions on the substrate to obtain a shape and a position of the shot regions on the substrate, wherein the plurality of shot regions includes a first shot region in which all of the marks to be formed in one shot region are formed and a second shot region in which some of the marks to be formed in one shot region are formed;
    (B) a deformation unit configured to deform the pattern region; and
    (C) a controller configured to control the imprint process, wherein the controller:
        (a) performs the imprint process on the first shot region prior to that on the second shot region and performs the imprint process on the second shot region after performing the imprint process on the first shot region;
        (b) controls an amount of deformation of the pattern region by the deformation unit so that a shape of the pattern region matches a shape of the first shot region obtained from the detector, when performing the imprint process on the first shot region;
        (c) calculates a preliminary shape of the second shot region by statistically processing results obtained by the detector by detecting marks formed in the first shot region when performing the imprint process on the first shot region and obtains a shape of the second shot region by correcting a portion of the preliminary shape of the second shot region according to a number of marks formed on the second shot region when performing the imprint process on the second shot region; and
        (d) controls the amount of deformation of the pattern region by the deformation unit so that the obtained shape of the second shot region matches the shape of the pattern region.

2. The apparatus according to claim 1, wherein, when bringing the mold and the imprint material into contact with each other when performing the imprint process on the first shot region, the controller controls the amount of deformation of the pattern region by the deformation unit to reduce a difference between a position of a mark formed on the mold and a position of the mark formed in the first shot region.

3. The apparatus according to claim 1, wherein
    the first shot region is a region to which a whole pattern of the pattern region of the mold can be transferred, and
    the second shot region is a region to which the whole pattern of the pattern region of the mold cannot be transferred.

4. The apparatus according to claim 1, wherein
    a plurality of chip regions are formed on the pattern region,
    all of the plurality of chip regions are transferred to the first shot region, and
    at least one of the plurality of chip regions is transferred to the second shot region.

5. The apparatus according to claim 1, wherein, when bringing the mold and the imprint material into contact with each other when performing the imprint process on the first shot region, the controller positions at least one of the mold and the substrate such that positions of marks formed on the mold match positions of the marks formed in the first shot region.

6. The apparatus according to claim 1, wherein the controller positions at least one of the mold and the substrate by controlling the detector to detect the marks formed on the second shot region and marks formed on the mold.

* * * * *